(12) United States Patent
Kamitsubo et al.

(10) Patent No.: US 12,036,776 B2
(45) Date of Patent: Jul. 16, 2024

(54) RESIN MULTILAYER SUBSTRATE AND METHOD FOR MANUFACTURING RESIN MULTILAYER SUBSTRATE

(71) Applicant: Murata Manufacturing Co., Ltd., Nagaokakyo (JP)

(72) Inventors: Yusuke Kamitsubo, Nagaokakyo (JP); Tsuyoshi Katsube, Nagaokakyo (JP); Ryosuke Takada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 398 days.

(21) Appl. No.: 17/331,744

(22) Filed: May 27, 2021

(65) Prior Publication Data
US 2021/0283890 A1 Sep. 16, 2021

Related U.S. Application Data

(63) Continuation of application No. PCT/JP2019/048598, filed on Dec. 12, 2019.

(30) Foreign Application Priority Data

Dec. 13, 2018 (JP) .................................. 2018-233365

(51) Int. Cl.
*B32B 27/08* (2006.01)
*B32B 3/02* (2006.01)
(Continued)

(52) U.S. Cl.
CPC ................ *B32B 27/08* (2013.01); *B32B 3/02* (2013.01); *B32B 3/266* (2013.01); *B32B 15/08* (2013.01);
(Continued)

(58) Field of Classification Search
CPC ........... B32B 3/02; B32B 3/266; B32B 27/08; B32B 15/08; B32B 27/18; B32B 27/304;
(Continued)

(56) References Cited

U.S. PATENT DOCUMENTS

| 5,744,758 A | 4/1998 | Takenouchi et al. |
| 2008/0083560 A1* | 4/2008 | Saiki ................. H01L 23/49827 174/255 |

(Continued)

FOREIGN PATENT DOCUMENTS

| JP | 09-116273 A | 5/1997 |
| JP | 2001-160686 A | 6/2001 |

(Continued)

OTHER PUBLICATIONS

Official Communication issued in International Patent Application No. PCT/JP2019/048598, mailed on Feb. 10, 2020.

*Primary Examiner* — Catherine A. Simone
(74) *Attorney, Agent, or Firm* — Keating & Bennett, LLP

(57) ABSTRACT

A resin multilayer substrate includes a laminate including resin layers including a first resin layer and a second resin layer that are laminated, a via conductor in the first resin layer, and a joint portion that includes at least a portion in the second resin layer and is joined to the via conductor. The joint portion is more brittle than the via conductor. A linear expansion coefficient of the second resin layer is larger than a linear expansion coefficient of the via conductor and a linear expansion coefficient of the joint portion, and is smaller than a linear expansion coefficient of the first resin layer.

9 Claims, 13 Drawing Sheets

(51) Int. Cl.

| | |
|---|---|
| *B32B 3/26* | (2006.01) |
| *B32B 7/025* | (2019.01) |
| *B32B 7/027* | (2019.01) |
| *B32B 15/08* | (2006.01) |
| *B32B 27/18* | (2006.01) |
| *B32B 27/30* | (2006.01) |
| *B32B 37/10* | (2006.01) |
| *H05K 1/02* | (2006.01) |
| *H05K 1/03* | (2006.01) |
| *H05K 1/11* | (2006.01) |
| *H05K 3/32* | (2006.01) |
| *H05K 3/40* | (2006.01) |
| *H05K 3/42* | (2006.01) |
| *H05K 3/46* | (2006.01) |

(52) U.S. Cl.
CPC ............ *B32B 27/18* (2013.01); *B32B 27/304* (2013.01); *B32B 37/10* (2013.01); *H05K 1/028* (2013.01); *H05K 1/036* (2013.01); *H05K 1/115* (2013.01); *H05K 3/321* (2013.01); *H05K 3/4046* (2013.01); *H05K 3/4076* (2013.01); *H05K 3/429* (2013.01); *H05K 3/4623* (2013.01); *B32B 7/025* (2019.01); *B32B 7/027* (2019.01); *B32B 2305/34* (2013.01); *B32B 2305/55* (2013.01); *B32B 2307/202* (2013.01); *B32B 2307/536* (2013.01); *B32B 2307/732* (2013.01); *B32B 2457/08* (2013.01); *H05K 2203/0235* (2013.01)

(58) Field of Classification Search
CPC ..... B32B 7/025; B32B 7/027; B32B 2305/34; B32B 2305/55; B32B 2307/202; B32B 2307/536; B32B 2307/732; B32B 2457/08; H05K 1/028; H05K 1/036; H05K 1/115; H05K 3/321; H05K 3/4046; H05K 3/4076; H05K 3/429; H05K 3/4623; H05K 2203/0235
See application file for complete search history.

(56) References Cited

U.S. PATENT DOCUMENTS

| | | |
|---|---|---|
| 2018/0145391 A1 | 5/2018 | Gouchi |
| 2018/0213637 A1 | 7/2018 | Hosoda et al. |
| 2020/0091104 A1 | 3/2020 | Takada et al. |
| 2021/0092832 A1 | 3/2021 | Tonaru |

FOREIGN PATENT DOCUMENTS

| | | |
|---|---|---|
| JP | 2005-268365 A | 9/2005 |
| JP | 2008-103640 A | 5/2008 |
| WO | 2017/065094 A1 | 4/2017 |
| WO | 2017/069217 A1 | 4/2017 |
| WO | 2018/216597 A1 | 11/2018 |
| WO | 2019/244869 A1 | 12/2019 |

* cited by examiner

RESIN MULTILAYER SUBSTRATE AND METHOD FOR MANUFACTURING RESIN MULTILAYER SUBSTRATE

CROSS REFERENCE TO RELATED APPLICATIONS

This application claims the benefit of priority to Japanese Patent Application No. 2018-233365 filed on Dec. 13, 2018 and is a Continuation Application of PCT Application No. PCT/JP2019/048598 filed on Dec. 12, 2019. The entire contents of each application are hereby incorporated herein by reference.

BACKGROUND OF THE INVENTION

1. Field of the Invention

The present invention relates to a resin multilayer substrate including a plurality of resin layers including different types of resin layers that are laminated, and a method for manufacturing the resin multilayer substrate.

2. Description of the Related Art

Conventionally, a resin multilayer substrate has been known that includes a laminate formed by laminating a plurality of resin layers including resin layers made of different materials and a via conductor formed in the laminate.

For example, JP 2001-160686A discloses a resin multilayer substrate having a configuration formed by laminating a first resin layer and a second resin layer made of different materials, in which a via conductor (plating via) formed in the first resin layer is joined to another conductor by a joint portion (conductive paste) provided to the second resin layer.

When a multilayer substrate is formed by laminating a plurality of resin layers made of different materials, a laminate is formed by performing heat pressing on the plurality of resin layers. In this case, a low melting point material is used for the joint portion so that the resin layers can be adhered to each other in a low-temperature state. However, many materials categorized as such low melting point material are more brittle than the via conductor. Thus, when the linear expansion coefficient of the second resin layer in contact with the joint portion is large, there is a risk of damaging the joint portion with stress applied to the joint portion, due to expansion of the second resin layer as a result of heating of the multilayer substrate (such as a reflow process, and bending involving heating, for example).

SUMMARY OF THE INVENTION

Preferred embodiments of the present invention provide resin multilayer substrates each including a laminate including a plurality of resin layers made of different materials, a via conductor in a laminate, and a joint portion, in each of which damage to the joint portion due to stress produced by heating is reduced or prevented.

A resin multilayer substrate according to a preferred embodiment of the present invention includes a laminate including a plurality of resin layers including a first resin layer and a second resin layer that are laminated; a via conductor in the first resin layer; a joint portion including at least a portion in the second resin layer and joined to the via conductor; and a conductor in the laminate and connected to the via conductor by the joint portion, wherein the joint portion is more brittle than the via conductor, and a linear expansion coefficient of the second resin layer is larger than a linear expansion coefficient of the via conductor and a linear expansion coefficient of the joint portion, and is smaller than a linear expansion coefficient of the first resin layer.

With this configuration, at least a portion of the joint portion that is relatively brittle is in contact with the second resin layer with a smaller linear expansion coefficient than the first resin layer, such that the stress applied to the joint portion when the resin multilayer substrate is heated can be reduced from a case in where the joint portion is in contact with the first resin layer only. Thus, damage to the joint portion at the time of heating of the resin multilayer substrate can be reduced or prevented.

A method of manufacturing a resin multilayer substrate according to a preferred embodiment of the present invention includes an attaching step of attaching, to a first resin layer, a second resin layer with a smaller linear expansion coefficient than the first resin layer; a via conductor forming step of providing a through hole through the first resin layer and the second resin layer bonded after the attaching step, and forming a via conductor by filling the through hole with a metal material on at least side of the first resin layer; a joint portion forming step of providing, after the via conductor forming step, a joint portion more brittle than the via conductor on at least a side of the second resin layer of the through hole to contact with the via conductor; and a laminate forming step of forming, after the joint portion forming step, a laminate by laminating and performing heat pressing on a plurality of resin layers including the first resin layer and the second resin layer attached to each other with the joint portion in contact with a conductor formed in another resin layer, and joining the via conductor with the conductor via the joint portion.

By the above manufacturing method, it is possible to easily manufacture a resin multilayer substrate in which damage to joint portions due to thermal expansion of a plurality of resin layers because of heating is reduced or prevented.

With preferred embodiments of the present invention, resin multilayer substrates each including a plurality of resin layers made of different materials that are laminated, a via conductor in the laminate, and a joint portion, in which a damage to the joint portion due to stress produced by heating is reduced or prevented can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
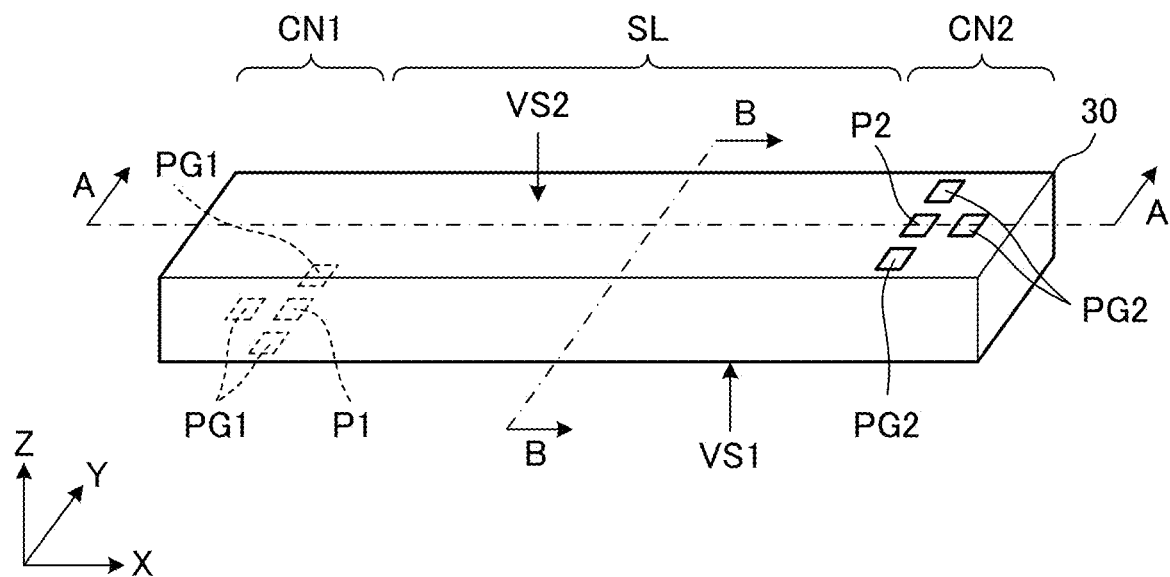
FIG. 1 is an external perspective view of a resin multilayer substrate 101 according to a first preferred embodiment of the present invention.

Hereinafter, preferred embodiments of the present invention will be described in detail with reference to the drawings. In each drawing, the same or corresponding portions and elements are designated by the same reference numerals. Although preferred embodiments are described separately, for convenience, in consideration of the description of main points or the ease of understanding, configurations described in different preferred embodiments can be partially replaced or combined. In second and subsequent preferred embodiments, a description of matters common to a first preferred embodiment will be omitted, and only different points will be described. In particular, the same or similar advantageous effects obtained by the same or similar configurations will not be repeatedly described for each preferred embodiment.

First Preferred Embodiment

Figure 2:
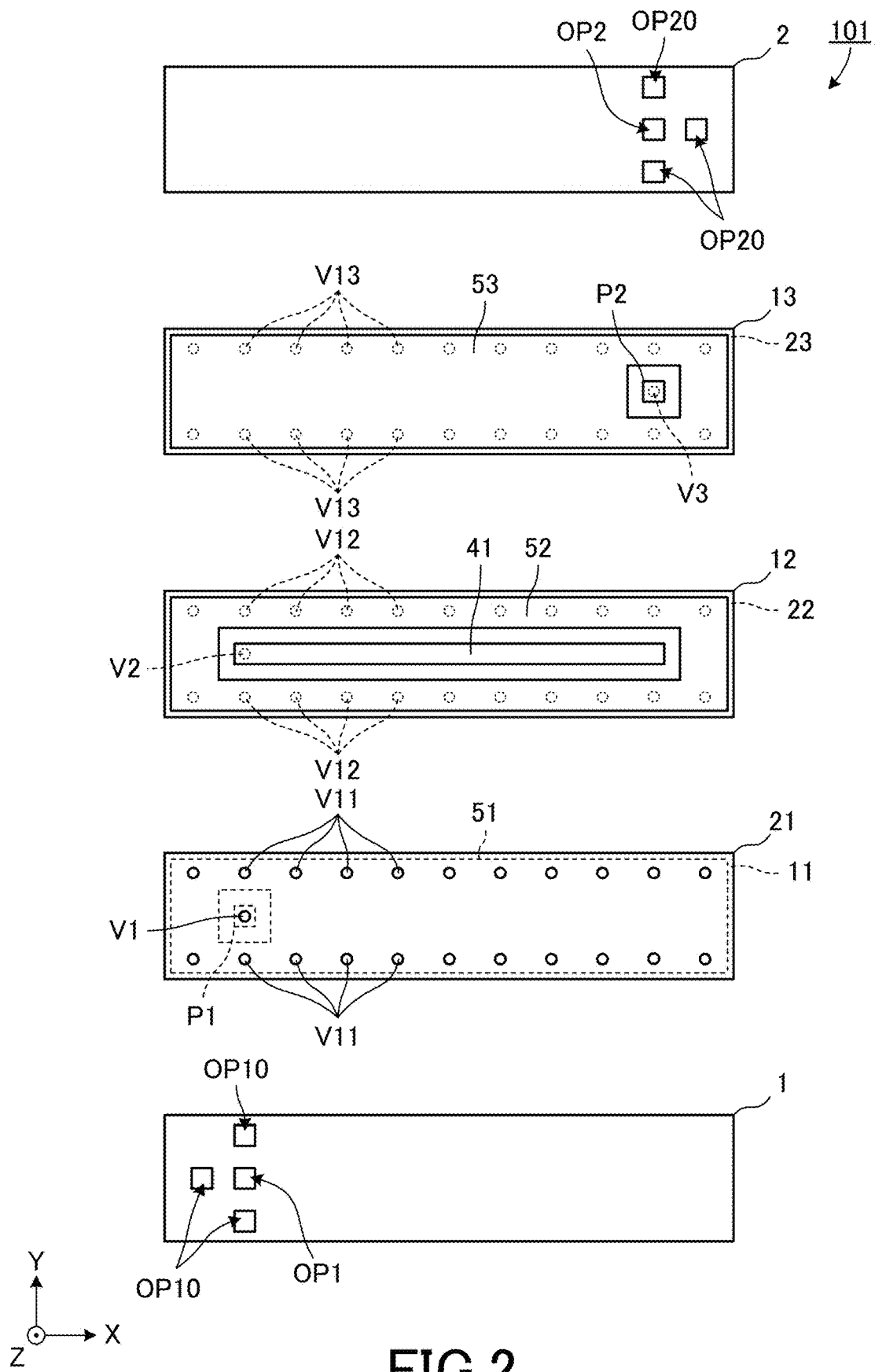
FIG. 2 is an exploded plan view of the resin multilayer substrate 101.
Figure 3A:
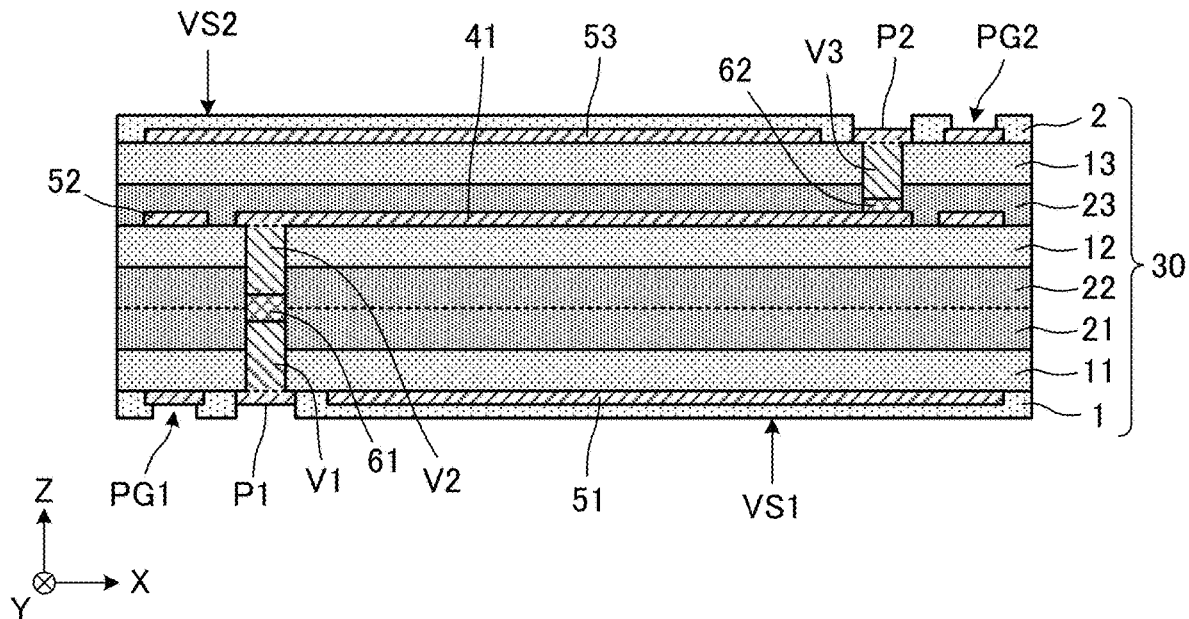
FIG. 3A is a sectional view taken along line A-A in FIG. 1.
Figure 3B:
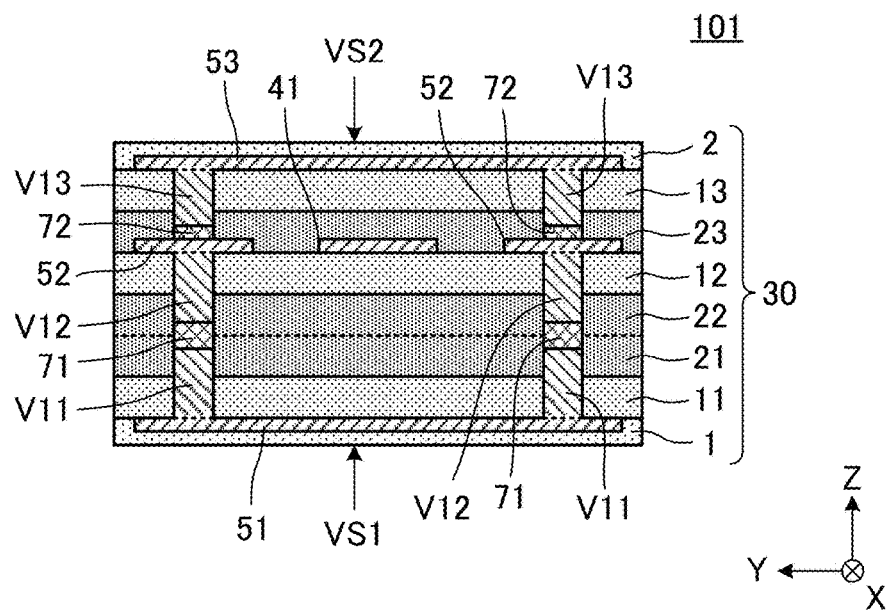
FIG. 3B is a sectional view taken along line B-B in FIG. 1.

FIG. 1 is an external perspective view of a resin multilayer substrate 101 according to a first preferred embodiment of the present invention. FIG. 2 is an exploded plan view of the resin multilayer substrate 101. FIG. 3A is a sectional view taken along line A-A in FIG. 1, and FIG. 3B is a sectional view taken along line B-B in FIG. 1.

The resin multilayer substrate 101 is, for example, a cable to connect a plurality of circuit boards to each other, as will be described in detail later. The resin multilayer substrate 101 includes a first connection portion CN1, a second connection portion CN2, and a line portion SL. In the first connection portion CN1, a mounting electrode P1 and ground electrodes PG1 are exposed on the lower surface (first main surface VS1) illustrated in FIG. 1. In the second connection portion CN2, a mounting electrode P2 and ground electrodes PG2 are exposed on the upper surface (second main surface VS2) illustrated in FIG. 1. As will be described in detail later, in the line portion SL, a transmission line having a strip line structure connecting the first connection portion CN1 and the second connection portion CN2 to each other is provided.

The resin multilayer substrate 101 includes a laminate 30, a signal conductor 41, mounting electrodes P1, P2, ground electrodes PG1, PG2, ground conductors 51, 52, 53, via conductors V1, V2, V3, V11, V12, V13, joint portions 61, 62, 71, 72, and the like.

The laminate 30 is a rectangular or substantially rectangular flat plate with a longitudinal direction matching an X-axis direction, and includes the first main surface VS1 and the second main surface VS2 opposite to each other. The signal conductor 41, the ground conductors 51, 52, 53, the via conductors V1, V2, V3, V11, V12, V13, and the joint portions 61, 62, 71, 72 are provided inside the laminate 30. The mounting electrode P1 and the ground electrode PG1 are exposed on the first main surface VS1, and the mounting electrode P2 and the ground electrode PG2 are exposed on the second main surface VS2.

The laminate 30 is formed by laminating a plurality of resin layers including a first resin layer and a second resin layer made of thermoplastic resin, and protective layers 1, 2. Specifically, the laminate 30 is formed by laminating the protective layer 1, a first resin layer 11, second resin layers 21, 22, a first resin layer 12, a second resin layer 23, a first resin layer 13, and a protective layer 2 in this order.

The first resin layers 11, 12, 13 and the second resin layers 21, 22, 23 are each a flexible rectangular or substantially rectangular flat plate with a longitudinal direction extending in the X-axis direction. For example, the first resin layers 11, 12, 13 are preferably sheets including, as a main component, a fluororesin, such as perfluoroalkoxy alkane (PFA) and polytetrafluoroethylene (PTFE). The second resin layers 21, 22, 23 are preferably sheets including, for example, a liquid crystal polymer (LCP) or a polyetheretherketone (PEEK) as the main component.

The mounting electrode P1 and the ground conductor 51 are provided on the back surface of the first resin layer 11. The mounting electrode P1 is a rectangular or substantially rectangular conductor pattern provided near a first end of the first resin layer 11 (a left end of the first resin layer 11 in FIG. 2). The ground conductor 51 is a planar conductor pattern provided over the entire or substantially the entire surface of the first resin layer 11. The mounting electrode P1 and the ground conductor 51 are conductor patterns preferably made of a copper (Cu) foil or the like, for example. The second resin layer 21 has the same or substantially the same shape as the first resin layer 11 and is attached to the front surface of the first resin layer 11.

The via conductor V1 and the plurality of via conductors V11 are provided in the first resin layer 11. The via conductor V1 is disposed near the first end of the first resin layer 11. The via conductors V11 are provided in a transmission direction (X-axis direction). The via conductors V1, V11 are preferably, for example, plating films made by plating Cu or the like in through holes provided in the first resin layer 11 and the second resin layer 21.

The signal conductor 41 and the ground conductor 52 are provided on the front surface of the first resin layer 12. The signal conductor 41 is a linear conductor pattern extending in the transmission direction (X-axis direction). The ground conductor 52 is a planar conductor pattern provided over the entire or substantially the entire surface of the first resin layer 12. The signal conductor 41 and the ground conductor 52 are conductor patterns such as Cu foil, for example. The second resin layer 22 having the same or substantially the same shape as the first resin layer 12 is attached to the back surface of the first resin layer 12.

The via conductor V2 and the plurality of via conductors V12 are provided in the first resin layer 12. The via conductor V2 is adjacent to on in a vicinity of a first end of the first resin layer 12 (a left end of the first resin layer 12 in FIG. 2). The via conductors V12 are provided in a transmission direction (X-axis direction). The via conductors V2, V12 are, for example, through hole plating formed by plating Cu or the like in through holes provided in the first resin layer 12 and the second resin layer 22 or field via plating.

The plurality of joint portions 61, 71 are provided in the second resin layers 21, 22. The joint portion 61 is joined to each of the via conductors V1 and V2, and the joint portion 71 is joined to each of the via conductors V11 and V12. For example, the joint portions 61 and 71 are low melting point conductive joint materials including metal, such as Cu and Tin (Sn) and resin material, for example.

The mounting electrode P2 and the ground conductor 53 are provided on the front surface of the first resin layer 13. The mounting electrode P2 is a rectangular or substantially rectangular conductor pattern adjacent to or in a vicinity of a second end of the first resin layer 13 (a right end of the first resin layer 13 in FIG. 2). The ground conductor 53 is a planar conductor pattern provided over the entire or substantially the entire surface of the first resin layer 13. The mounting electrode P2 and the ground conductor 53 are conductor patterns of a Cu foil or the like, for example. The second resin layer 23 having the same or substantially the same shape as the first resin layer 13 is attached to the back surface of the first resin layer 13.

The via conductor V3 and the plurality of via conductors V13 are provided in the first resin layer 13. The via conductor V3 is adjacent to or in a vicinity of the second end of the first resin layer 13. The via conductors V13 are provided in the transmission direction (X-axis direction). The via conductors V3, V13 are, for example, through hole plating formed by plating Cu or the like in through holes provided in the first resin layer 13 and the second resin layer 23 or the field via plating.

The plurality of joint portions 62, 72 are provided in the second resin layer 23. The joint portion 62 is joined to each of the signal conductor 41 and the via conductor V3, and the joint portion 72 is joined to each other the ground conductor 52 and the via conductor V13. For example, the joint portions 62 and 72 are low melting point conductive joint materials including metal such as Cu and Sn and resin material.

The protective layer 1 is a protective film laminated on the back surface of the first resin layer 11, and has the same or substantially the same planar shape as the first resin layer 11. The protective layer 2 is a protective film laminated on the front surface of the first resin layer 13, and has the same or substantially the same planar shape as the first resin layer 13. The protective layers 1, 2 are, for example, coverlay films or solder resist films, and are, for example, epoxy resin films or the like.

The protective layer 1 includes an opening OP1 and a plurality of openings OP10. The opening OP1 is provided at a position corresponding to the position of the mounting electrode P1, and the openings OP10 are provided at positions corresponding to the position of the ground conductor 51. Thus, even when the protective layer 1 is provided on the back surface of the first resin layer 11, the mounting electrode P1 is exposed to the outside from the opening OP1, and a portion of the ground conductor 51 is exposed to the outside from the openings OP10. In the present preferred embodiment, a portion of the ground conductor 51 exposed from the plurality of openings OP10 is the ground electrodes PG1. The protective layer 2 includes an opening OP2 and a plurality of openings OP20. The opening OP2 is provided at a position corresponding to the position of the mounting electrode P2, and the openings OP20 are provided at positions corresponding to the position of the ground conductor 53. Thus, even when the protective layer 2 is provided on the front surface of the first resin layer 13, the mounting electrode P2 is exposed to the outside from the opening OP2, and a portion of the ground conductor 53 is exposed to the outside from the openings OP20. In the present preferred embodiment, a portion of the ground conductor 53 exposed from the plurality of openings OP20 is the ground electrodes PG2.

As illustrated in FIG. 3A and the like, the mounting electrode P1 is connected to one end of the signal conductor 41 by the via conductors V1 and V2 and the joint portion 61. The other end of the signal conductor 41 is connected to the mounting electrode P2 by the via conductor V3 and the joint portion 62. Thus, the mounting electrodes P1, P2 are electrically connected to each other. Furthermore, as illustrated in FIG. 3B and the like, the ground conductor 51 (ground electrode PG1) is connected to the ground conductor 52 by the via conductors V11 and V12 and the joint portion 71. The ground conductor 52 is connected to the ground conductor 53 (ground electrode PG2) by the via conductor V13 and the joint portion 72.

In the present preferred embodiment, a transmission line of the strip line structure includes the signal conductor 41, the ground conductor 51, 53, the first resin layers 11, 12 and the second resin layers 21, 22 sandwiched by the signal conductor 41 and the ground conductor 51, and the first resin layer 13 and the second resin layer 23 sandwiched by the signal conductor 41 and the ground conductor 53.

The via conductors V1, V2, V3, V11, V12, V13 formed by plating have fine structure, high mechanical strength (with high metal density) and better hardness, as compared with the joint portions 61, 62, 71, 72 that are low melting point conductive joint materials. Thus, the joint portions 61, 62, 71, 72 are more brittle than the via conductors V1, V2, V3, V11, V12, V13. Here, "the joint portion is more brittle than the via conductor" indicates, for example, a case where the indentation hardness of the joint portion is lower than the indentation hardness of the via conductor. The indentation hardness is, for example, Vickers hardness (HV).

The Vickers hardness (HV) is calculated by the following formula.

$$HV = F/S \qquad \text{(Formula 1)}$$

F: Test force (kgf)
S: Surface area of recess (mm$^2$)

The Vickers hardness (HV) is measured, for example, by micro-Vickers hardness test (JIS Z 2244).

The linear expansion coefficient (CT2) of the second resin layers 21, 22, 23 is larger than the linear expansion coefficient (CTV) of the via conductors V1, V2, V3, V11, V12, V13 and the linear expansion coefficient (CT5) of the joint portions 61, 62, 71, 72 (CT2>CTV, CT2>CT5). The linear expansion coefficient (CT2) of the second resin layers 21, 22, 23 is smaller than the linear expansion coefficient (CT1) of the first resin layers 11, 12, 13 (CT2<CT1). More specifically, a difference in linear expansion coefficient between the second resin layers 21, 22, 23 and the joint portions 61, 62, 71, 72 is smaller than a difference in linear expansion coefficient between the first resin layers 11, 12, 13 and the via conductors V1, V2, V3, V11, V12, V13.

The linear expansion coefficient of polytetrafluoroethylene (PTFE), which is the main component of the first resin layers 11, 12, 13, is, for example, about 50 to about 150 ($10^{-6}$/K). The linear expansion coefficient of liquid crystal polymer (LCP), which is the main component of the second resin layers 21, 22, 23, is, for example, about 10 to about 25 ($10^{-6}$/K).

The linear expansion coefficient can be measured by, for example, a Thermo-mechanical analysis (TMA) method.

In the present preferred embodiment, the joint portions 61, 62, 71, 72 are conductive joint materials including a metal material and a resin material, and include an organic substance (carbon). The joint portions 61, 62, 71, 72 include a larger amount of organic substances than the via conductors formed by plating, and thus are likely to produce gas upon being heated. Thus, the amount of gas produced at the joint portions 61, 62, 71, 72 at heating is larger than the amount of gas produced at the via conductors V1, V2, V3, V11, V12, V13 at heating. In addition, the joint portions 61, 62, 71, 72 include many voids (high void content rate) as an indication of gas production. Therefore, the void content rate of the joint portions 61, 62, 71, 72 is higher than the void content rate of the via conductors V1, V2, V3, V11, V12, V13. Specifically, the void content rate (PR1) per unit plane sectional area of the joint portions 61, 62, 71, 72 (per unit area of the joint portion in the XY plane) is higher than the void content rate (PR2) per unit plane sectional area of the via conductors V1, V2, V3, V11, V12, V13 (PR1>PR2).

The conductive joint material used for the joint portion is formed by solidifying a conductive paste including low melting point metal. When the resin multilayer substrate is used for purposes such as high-frequency transmission lines, Cu or the like, for example, having a small conductor loss is preferably used as a wiring conductor, but the melting point of Cu is high. In view of this, a method of forming a Cu—Sn based intermetallic compound between Cu and a Cu paste or a Cu—Sn based conductive paste with a lower melting point than Cu is used. With the intermetallic compound in a connection portion between the via conductor that is a plating via and the joint portion that is a conductive joint material, an interface between the via conductor and the joint portion is difficult to accurately determine. The interface between the joint portion and the via conductor is determined by any of the following methods (1) and (2).

Figure 4A:
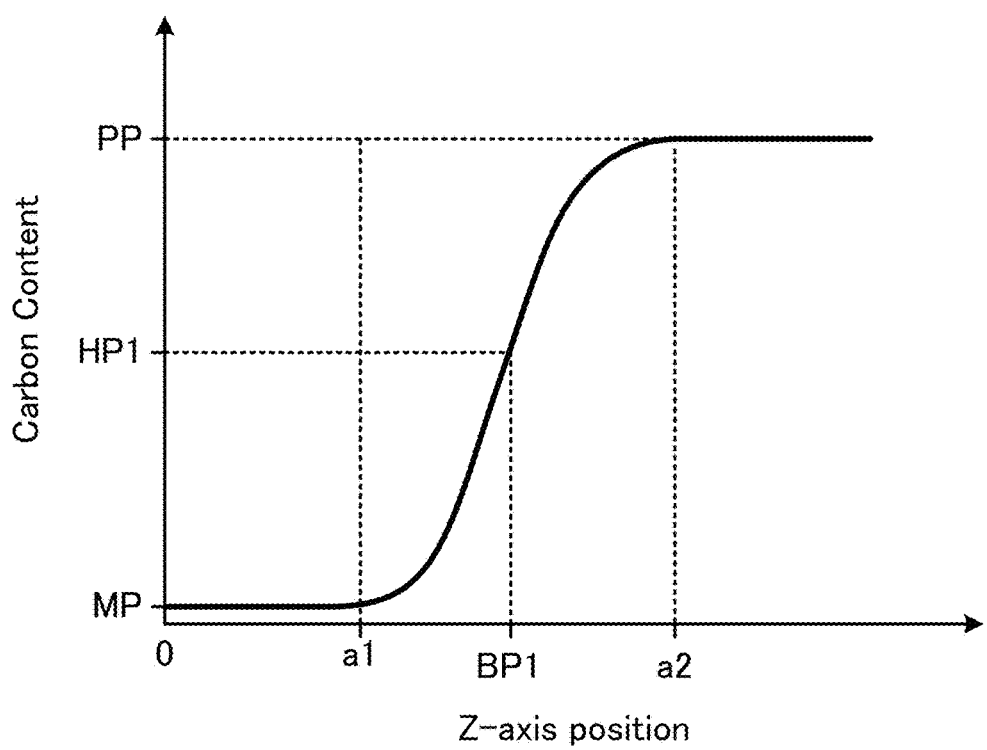
FIG. 4A is a diagram illustrating the carbon content in a Z-axis direction near an interface between a via conductor and a joint portion.
Figure 4B:
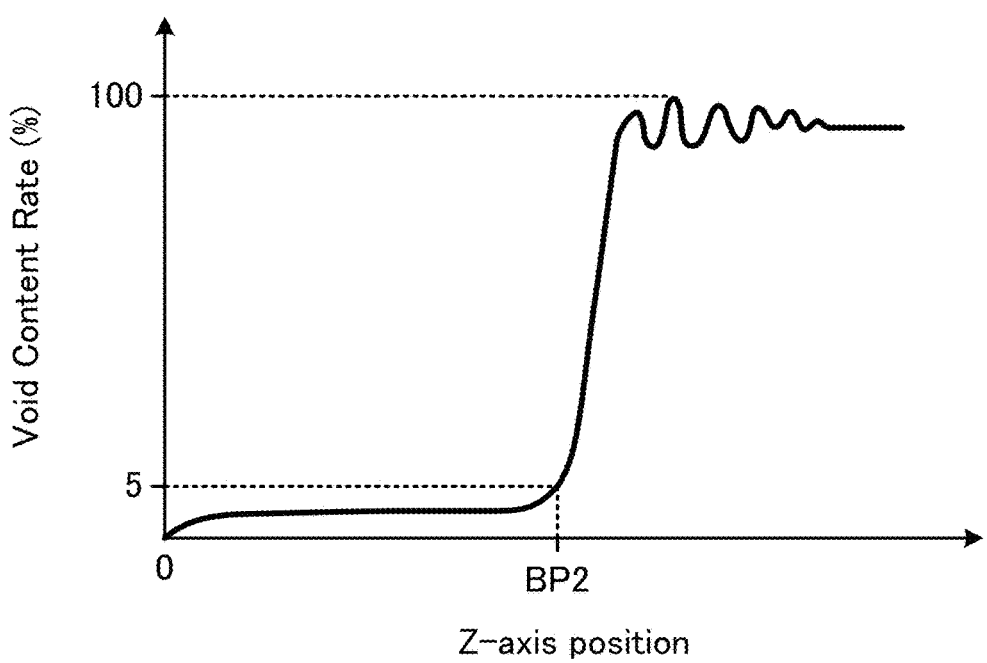
FIG. 4B is a diagram illustrating a void content rate per unit plane sectional area in the Z-axis direction near the interface between the via conductor and the joint portion.

FIG. 4A is a diagram illustrating the carbon content in the Z-axis direction near the interface between the via conductor and the joint portion, and FIG. 4B is a diagram illustrating a void content rate per unit plane sectional area in the Z-axis direction near the interface between the via conductor and the joint portion. In FIGS. 4A and 4B, the via conductor and the joint portion are joined in the Z-axis direction, and the via conductor and the joint portion are arranged in this order in the +Z direction. Thus, in FIGS. 4A and 4B, the composition transitions, in the +Z direction, from the "via conductor" to the "joint portion".

(1) Method of Determining Interface Between the Via Conductor and the Joint Portion Based on Carbon Content As described above, the joint portion includes organic substances, and thus has a high carbon content. In view of this, for example, the interface between the via conductor and the joint portion is determined to be at a position (BP1) at the middle or approximate middle of the distance in the Z-axis direction between a point a1 at which the carbon content starts to rise from the minimum value (MP) and a point a2 at which the maximum value (PP) is reached as illustrated in FIG. 4A (BP1=a1+(a2−a1)/2).

(2) Method of Determining Interface Between the Via Conductor and the Joint Portion Based on Void Content Rate As described above, the void content rate (PR1) per unit plane sectional area of the joint portion is higher than the void content rate (PR2) per unit plane sectional area of the via conductor (PR1>PR2). In view of this, for example, the interface between the via conductor and the joint portion is determined to be at a position (BP2) where the void content rate per unit plane sectional area, transitioning in the +Z direction, exceeds a value that is about 5% of the maximum value of the void content rate per unit plane sectional area (100%), as illustrated in FIG. 4B.

In the present preferred embodiment, the relative permittivity ($\varepsilon 1$) of the first resin layers 11, 12, 13 is lower than the relative permittivity ($\varepsilon 2$) of the second resin layers 21, 22, 23 ($\varepsilon 1 < \varepsilon 2$). In the present preferred embodiment, the via conductors V1, V2 (or the via conductors V11, V12) respectively provided in the two adjacent second resin layers 21, 22 are connected to each other via the joint portion 61 (or the joint portion 71) which is only in contact with the second resin layers 21, 22.

With the resin multilayer substrate 101 according to the present preferred embodiment, the following advantageous effects are obtained.

(a) In the present preferred embodiment, at least a portion of the relatively brittle joint portions 61, 62, 71, 72 is provided (in contact with) in the second resin layers 21, 22, 23 having a relatively small linear expansion coefficient. On the other hand, the via conductors V1, V2, V3, V11, V12, V13 having high mechanical strength are provided in the first resin layers 11, 12, 13 having a relatively large linear expansion coefficient. With this configuration, when the resin multilayer substrate is heated (for example, when the reflow process is performed at the time of mounting, at the time of mounting with a hot bar and the like, at the time of bending involving heating, or the like) the stress applied to the joint portions 61, 62, 71, 72 can be reduced from a configuration in which the joint portions 61, 62, 71, 72 are in contact with the first resin layers 11, 12, 13 only. Thus, even in the configuration including a plurality of resin layers made of different types of materials, the damage to the joint portions 61, 62, 71, 72 at the time of heating of the resin multilayer substrate can be reduced or prevented.

(b) In the present preferred embodiment, the via conductors V1, V2, V3, V11, V12, V13 are formed by plating Cu or the like, and are made of the same material (Cu) as the planar conductor (such as the mounting electrodes P1, P2, the signal conductor 41, and the ground conductors 51, 52, 53). Therefore, the via conductor and the planar conductor are integrated. Thus, the intermetallic compound is less likely to be formed at the connection portion between the via conductor and the planar conductor, such that the mechanical strength of the connecting portion between the via conductor and the planar conductor is increased.

(c) In the present preferred embodiment, the joint portions 61, 62, 71, 72 are not in contact with the first resin layers 11, 12, 13 having a relatively large linear expansion coefficient. With this configuration, the stress applied to the joint portions 61, 62, 71, 72 when the resin multilayer substrate is heated can be further reduced from that in a configuration in which a portion of the joint portions 61, 62, 71, 72 is in contact with the first resin layers 11, 12, 13. Therefore, damage to the joint portions 61, 62, 71, 72 at the time of heating the resin multilayer substrate is further reduced or prevented.

In the present preferred embodiment, the via conductors V11, V12 are connected to each other via the joint portion 71 which is in contact with the second resin layers 21, 22 only. At the joint surface (interface) between the different types of materials, such as between the first resin layer and the second resin layer, displacement is likely to occur when laminating a plurality of resin layers due to a difference in physical property (a difference in linear expansion coefficient, for example). Thus, due to the displacement, connection failure between the via conductors respectively provided in the different types of materials is likely to occur. Thus, the via conductor in the first resin layer and the via conductor in the second resin layer may be connected to each other, with a connecting conductor pattern having a large area provided therebetween for the displacement. On the other hand, the displacement is less likely to occur at the joint surface (interface) between the same materials, such as the second resin layers 21, 22, and thus in the joint portion of the via conductors V11, V12 by the joint portion 71 for example, the via conductors need not to be connected to each other by the connecting conductor pattern.

(d) In the present preferred embodiment, the relative permittivity (81) of the first resin layers 11, 12 is lower than the relative permittivity (82) of the second resin layers 21, 22, 23 ($\varepsilon1<\varepsilon2$). With this configuration, the conductor loss in a circuit provided on the resin multilayer substrate 101 can be smaller and the resin multilayer substrate 101 (laminate 30) can be thinner than those in a case of an insulating substrate including only the plurality of second resin layers. Specifically, the laminate 30 includes the first resin layers 11, 12 having a relative permittivity lower than that of the second resin layers 21, 22, 23. Thus, when a circuit having predetermined characteristics is provided on the resin multilayer substrate, the conductor pattern in the laminate 30 can have a wide line width, such that the conductor loss of the circuit can be reduced. Alternatively, when a circuit having predetermined characteristics is provided on the resin multilayer substrate, the resin layer can be thin without narrowing the line width of the conductor pattern, such that the laminate 30 can be made thin.

Furthermore, in the present preferred embodiment, as illustrated in FIG. 3A and the like, the first resin layer 11 having better high frequency characteristics is provided at a position in contact with the signal conductor 41, so that the high frequency characteristics of the resin multilayer substrate can be improved.

(e) In the present preferred embodiment, the plurality of resin layers (the first resin layers 11, 12, 13 and the second resin layers 21, 22, 23) are made of thermoplastic resin, for example. With this configuration, as will be described in detail later, by heat pressing (collectively pressing) a plurality of laminated resin layers, a laminate can be easily formed without using a resin layer for adhesion. Thus, the manufacturing process of the resin multilayer substrate 101 is simplified, such that the cost can be reduced. With this configuration, a resin multilayer substrate that can be easily plastically deformed and can be maintained in a desired shape can be obtained.

A resin multilayer substrate (laminate) made of a resin material (formed by laminating a plurality of resin layers) is partially thermally decomposed upon receiving heat of a predetermined temperature or higher, such that gas, such as $CO_2$, for example, and water are produced. When the resin multilayer substrate is heated with such gas and water remaining in the resin multilayer substrate, gas (gas or steam) expansion occurs, and thus delamination is likely to occur. Thus, when the resin multilayer substrate is manufactured, heat pressing is performed under reduced pressure, and a predetermined preheating step is provided to discharge the gas to the outside of the laminate during the heat pressing.

In the present preferred embodiment, the joint portions 61, 62, 71, 72 are conductive joint materials including metal such as, for example, Cu and Sn and a resin material, but the joint portions of the present invention are not limited thereto. The joint portions may be interlayer conductors obtained by solidifying a conductive paste including metal powder (metal which is, for example, Cu, Sn, or both and metal powder of an alloy of these) and a resin material, for example. These interlayer conductors can be formed simultaneously by heat pressing (described later) a plurality of resin layers, and thus can be easily formed. With the conductive paste including the resin material, high attachability to the resin layer is achieved. The resin material included in the conductive paste described above is preferably of the same or substantially the same type as the resin material of the resin layer.

However, the joint portions including the resin material have a large amount of gas production upon being heated, and when the resin multilayer substrate including such joint portions is heated (heated in a manufacturing stage or during use), delamination, formation of recesses and protrusions on the surface of the resin multilayer substrate, bending, and the like are likely to occur. Thus, when the joint portions are the interlayer conductors including the resin material, an opening is preferably provided near the joint portions of the planar conductors (such as the ground conductor, for example). With this configuration, the gas produced from the joint portions when the resin multilayer substrate is heated can be efficiently discharged, such that delamination of the resin multilayer substrate can be reduced or prevented and flatness of the resin multilayer substrate can be improved.

In the present preferred embodiment, an example of the resin multilayer substrate is described in which the planar shapes of the first resin layers 11, 12, 13 and the planar shapes of the second resin layers 21, 22, 23 match or substantially match. However, the planar shape of the first resin layer and the planar shape of the second resin layer do not necessarily need to match or substantially match. The planar shape of the first resin layer and the planar shape of the second resin layer may match or substantially match each other in the length along the X-axis direction, or in the length along the Y-axis direction, for example.

Figure 5:
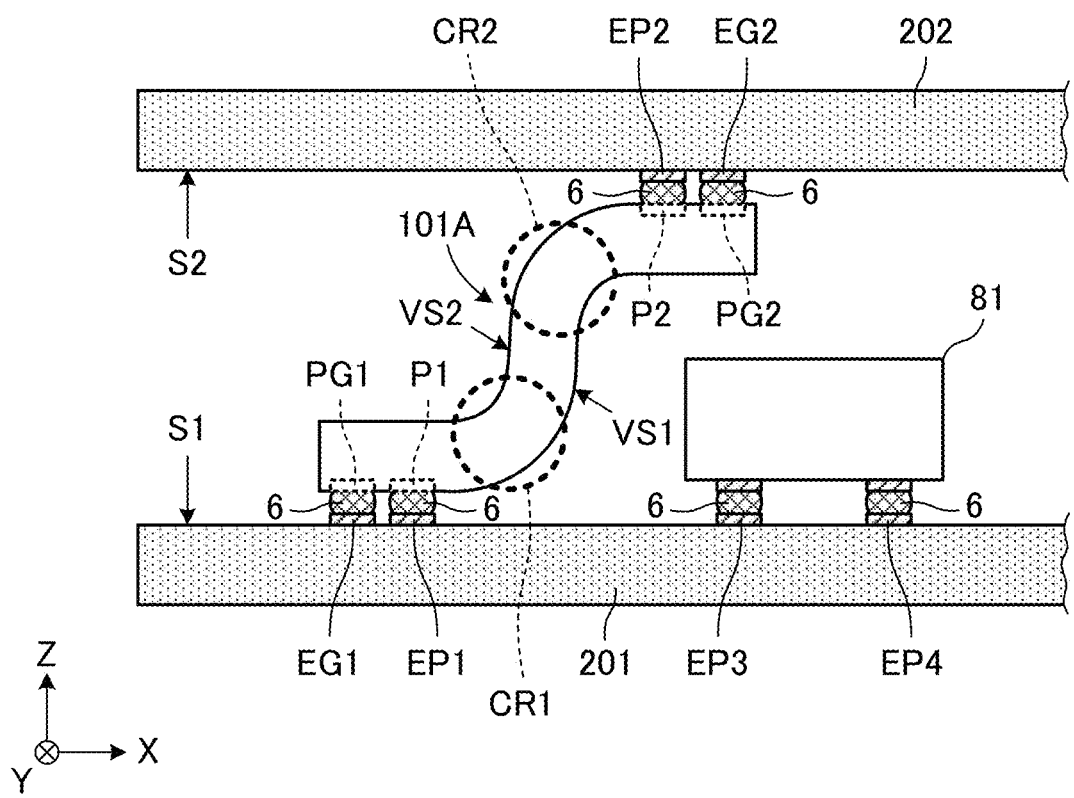
FIG. 5 is a front view illustrating a main portion of an electronic device 301 according to the first preferred embodiment of the present invention.

The resin multilayer substrate 101 is used, for example, as follows. FIG. 5 is a front view illustrating a main portion of an electronic device 301 according to the first preferred embodiment.

The electronic device 301 includes a resin multilayer substrate 101A, circuit boards 201, 202, a component 81, and the like. Although the electronic device 301 has configurations other than those described above, they are not illustrated in FIG. 5. The resin multilayer substrate 101A is different from the resin multilayer substrate 101 in that the laminate 30 includes bent portions CR1, CR2 (which is bent). The remaining configurations of the resin multilayer substrate 101A are the same as or similar to those of the resin multilayer substrate 101.

The circuit boards 201, 202 are, for example, glass-epoxy boards. The component 81 is, for example, a battery, a chip component, such as a chip inductor or a chip capacitor, an RFIC element, an impedance matching circuit, or the like.

The circuit board 201 includes a first surface S1 and the circuit board 202 includes a second surface S2. As illustrated in FIG. 5, the first surface S1 and the second surface S2 face each other in the Z-axis direction. External electrodes EP1, EG1 are provided on the first surface S1 of the circuit board 201. External electrodes EP2, EG2 are provided on the second surface S2 of the circuit board 202.

The resin multilayer substrate 101A is mounted on the circuit boards 201, 202 in a bent state. Specifically, the mounting electrode P1 of the resin multilayer substrate 101A is connected to the external electrode EP1 of the circuit board 201 by a conductive joint material 6, such as solder, for example. The ground electrode PG1 of the resin multilayer substrate 101 is connected to the external electrode EG1 of the circuit board 201 by a conductive joint material 6. The mounting electrode P2 of the resin multilayer substrate 101A is connected to the external electrode EP2 of the circuit board 202 by a conductive joint material 6. The ground electrode PG2 of the resin multilayer substrate 101A is connected to the external electrode EG2 of the circuit board 202 by a conductive joint material 6.

Further, the component 81 is connected to external electrodes EP3 and EP4 of the circuit board 201 by conductive joint materials 6.

As described above, since the resin multilayer substrate 101A is bent (plastically deformed), it can be easily mounted on the circuit boards 201, 202 with surfaces facing each other.

Figure 6:
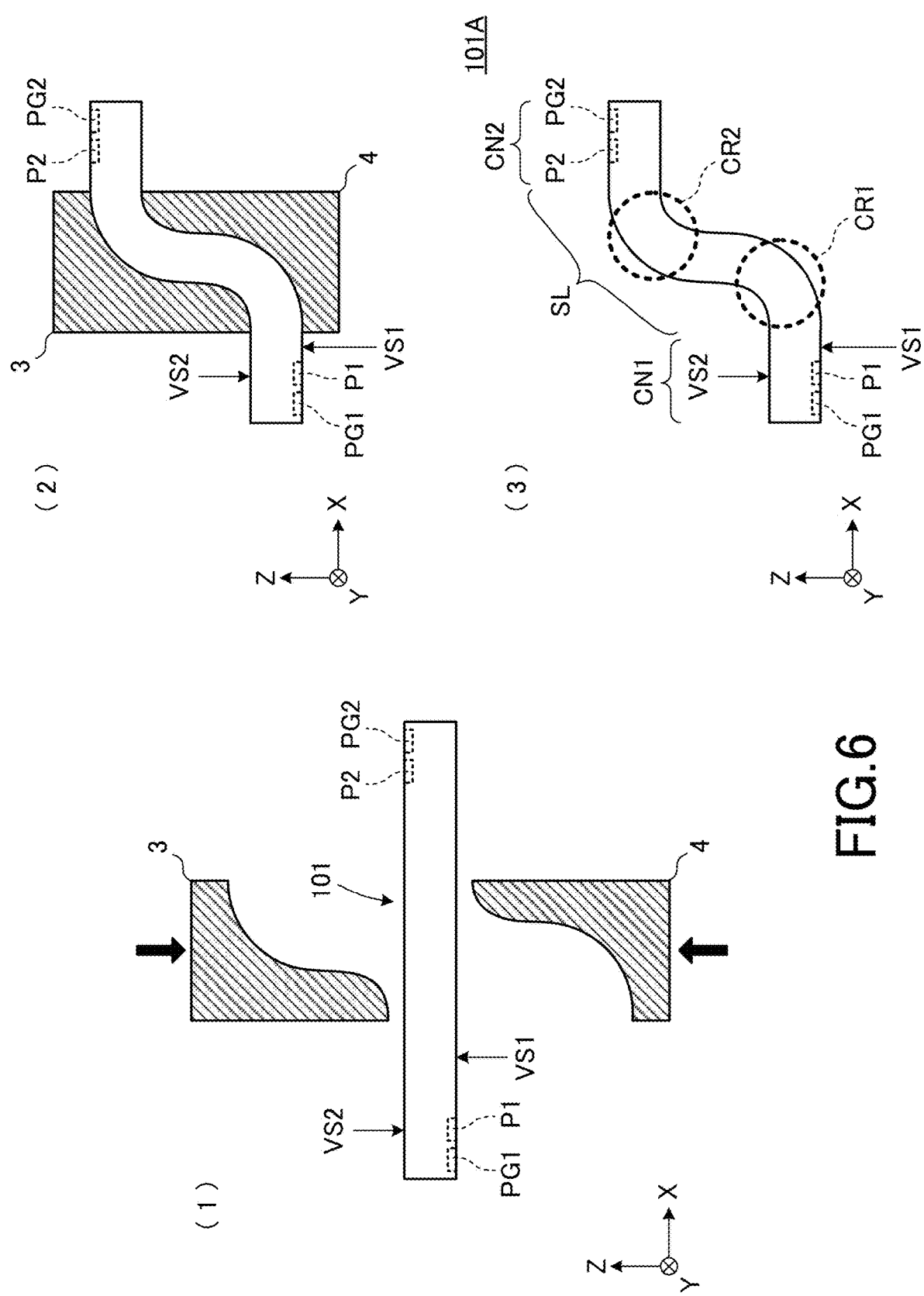
FIG. 6 is a front view illustrating bending of a resin multilayer substrate 101.

The resin multilayer substrate 101 according to the present preferred embodiment is bent (plastically deformed), for example, in the following non-limiting example of a process. FIG. 6 is a front view illustrating the bending of the resin multilayer substrate 101.

First, as illustrated in (1) and (2) of FIG. 6, the resin multilayer substrate 101 is prepared, and the first main surface VS1 and the second main surface VS2 of the laminate 30 are heated and pressurized in the Z-axis direction using an upper mold 3 and a lower mold 4. As illustrated in FIG. 6, the heating and pressurizing position is near the center of the laminate 30 in the longitudinal direction (Z-axis direction). The upper mold 3 and the lower mold 4 are metal structures with an L-shaped cross section.

After the laminate 30 made of a thermoplastic resin is cooled and solidified, the laminate 30 is removed from the upper mold 3 and the lower mold 4 to obtain the resin multilayer substrate 101A as illustrated in (3) of FIG. 6.

By such a manufacturing method, the resin multilayer substrate 101A that maintains (retains) a bent (plastically deformed) shape can be obtained. Further, in the case of bending under heat and pressure as described above, stress due to thermal expansion of the resin layer is applied to the joint portions, so that the brittle joint portions are likely to be damaged. Therefore, the configuration of the present preferred embodiment is particularly effective in reducing or preventing damage of the joint portions.

Figure 7:
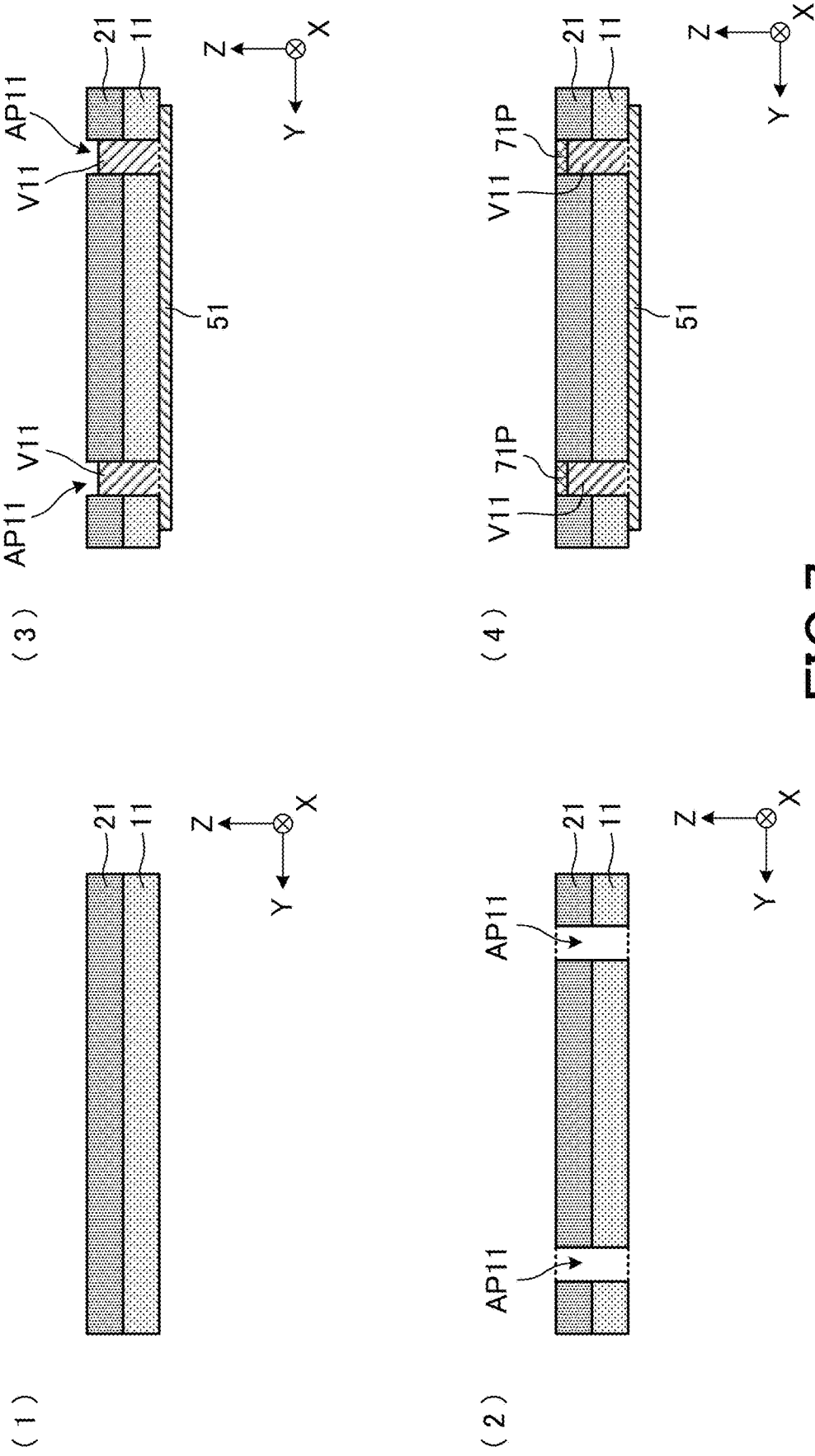
FIG. 7 is a cross-sectional view illustrating processes of forming a via conductor V11 and a joint portion 71P in a first resin layer 11 and a second resin layer 21 before heat pressing in order.
Figure 8:
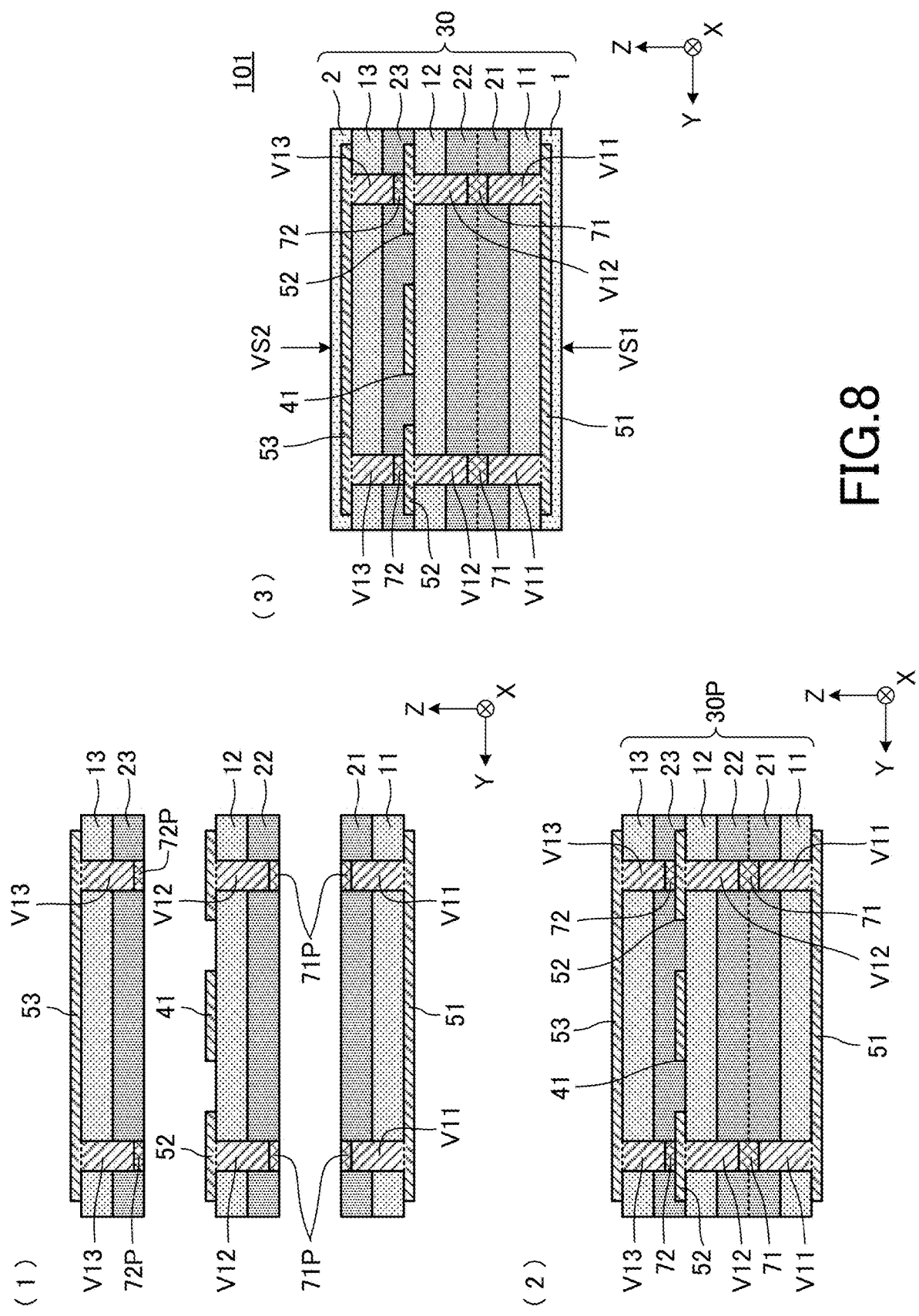
FIG. 8 is a cross-sectional view illustrating the manufacturing process of the resin multilayer substrate 101.

The resin multilayer substrate 101 according to the present preferred embodiment is manufactured by, for example, the following non-limiting example of a manufacturing method. FIG. 7 is a cross-sectional view illustrating the steps of forming the via conductor V11 and a joint portion 71P in the first resin layer 11 and the second resin layer 21 before heat pressing. FIG. 8 is a cross-sectional view illustrating the manufacturing process of the resin multilayer substrate 101.

In addition, in FIG. 7 and FIG. 8, for convenience of explanation, the manufacturing process of one chip (individual piece) will be described, but the actual manufacturing process of the resin multilayer substrate 101 is performed in an assembled substrate state. The "assembled substrate" refers to a mother board including a plurality of resin multilayer substrates 101. Further, steps for the first resin layers 12, 13 and the second resin layers 22, 23 are omitted because the steps are the same as or similar to those for the first resin layer 11 and the second resin layer 21 illustrated in FIG. 7. This also applies to cross-sectional views related to a manufacturing method described below.

First, as illustrated in (1) of FIG. 7, the front surface of the first resin layer 11 made of a thermoplastic resin and the back surface of the second resin layer 21 made of a thermoplastic resin are attached to each other. The linear expansion coefficient (CT2) of the second resin layer 21 is smaller than the linear expansion coefficient (CT1) of the first resin layer 11 (CT2<CT1). For example, the first resin layer 11 is a sheet including, as a main component, a fluororesin, such as perfluoroalkoxy alkane (PFA) and polytetrafluoroethylene (PTFE). For example, the second resin layer 21 is a sheet including, as a main component, a liquid crystal polymer (LCP) or the like.

This step of attaching the second resin layer having a linear expansion coefficient smaller than that of the first resin layer 11 to the first resin layer 11 is an example of the "attaching step".

Next, as illustrated in (2) of FIG. 7, a through hole AP11 is provided through the first resin layer 11 and second resin layer 21. The through hole AP11 is formed by grinding, polishing, and etching with a drill or the like, for example.

Thereafter, a ground conductor 51 or the like is formed on the back surface of the first resin layer 11. Specifically, metal foil (Cu or the like), for example, is laminated on the back surface of the first resin layer 11, and the laminated metal foil is patterned by photolithography to form the ground conductor 51 or the like on the back surface of the first resin layer 11. The mounting electrode (P1) is also formed on the back surface of the first resin layer 11, but is not illustrated.

Next, as illustrated in (3) of FIG. 7, at least the first resin layer 11 side of the through hole AP11 is filled with a metal material (Cu or the like) to form the via conductor V11. Specifically, a plating film is formed on the front surface of the ground conductor 51 in the through hole AP11 and the inner wall of the through hole AP11 by plating.

This step of providing the through holes AP11 in the attached first resin layer 11 and second resin layer 21 and filling at least the first resin layer 11 side of the through holes AP11 with the metal material to form the via conductor V11 is an example of the "via conductor forming step".

Next, as illustrated in (4) of FIG. 7, the joint portion 71P is provided on at least the second resin layer 21 side of the through hole AP11 so as to be in contact with the via conductor V11. Specifically, the joint portion 71P is provided on the front surface of the via conductor V11 (the upper surface of the via conductor V11 illustrated in (3) and (4) of FIG. 7). The joint portion 71P is a conductive paste including, for example, a metal, such as Cu or Sn, and a resin material.

This step of providing the joint portion 71P on at least the second resin layer 21 side of the through hole AP11 so as to be in contact with the via conductor V11 is an example of the "joint portion forming step".

Next, as illustrated in (1) of FIG. 8, a plurality of resin layers including the first resin layer 11 and the second resin layer 21 (first resin layers 11, 12, 13 and second resin layers 21, 22, 23) are laminated so that the conductors and the joint portions formed in different resin layers come into contact with each other. At this time, the joint portion 71P formed in the second resin layer 21 and the joint portion 71P formed in the second resin layer 22 come into contact with each other. Further, the joint portion 72P formed in the second resin layer 23 and the ground conductor 52 formed in the first resin layer 12 come into contact with each other.

Next, as illustrated in (2) of FIG. 8, the first resin layers 11, 12, 13 and the second resin layers 21, 22, 23 are heat pressed (collective press) in a laminating direction (Z-axis direction), such that a laminate 30P is formed. The joint portion 71P is solidified by the heat generated during the heat pressing and becomes a joint portion 71 that is more brittle than the via conductors. Further, the joint portion 72P is solidified by the heat during the heat pressing and becomes a joint portion 72 that is more brittle than the via conductors. As a result, the via conductor V11 is joined to the via conductor V12 by the joint portion 71, and the via conductor V13 is joined to the ground conductor 52 by the joint portion 72.

This step of laminating and performing heat pressing on the plurality of resin layers including the first resin layer and the second resin layer so that the conductors and the joint portions in different resin layers come into contact with each other to form the laminate 30P is an example of the "laminate forming step".

Thereafter, the protective layer 1 is formed on the lower surface of the laminate 30P (the back surface of the first resin layer 11), and the protective layer 2 is formed on the upper surface of the laminate 30P (the front surface of the first resin layer 13), such that the resin multilayer substrate 101 (laminate 30) is obtained as illustrated in (3) of FIG. 8. The protective layers 1, 2 are, for example, coverlay films or solder resist films, and are, for example, epoxy resin films or the like.

By the above manufacturing method, it is possible to easily manufacture a resin multilayer substrate in which damage to joint portions due to thermal expansion of a plurality of resin layers as a result of heating is reduced or prevented.

Further, since the above manufacturing method includes the step of laminating and performing heat pressing on the plurality of resin layers (first resin layers 11, 12, 13 and second resin layers 21, 22, 23) made of a thermoplastic resin, the manufacturing process of the resin multilayer substrate 101 is simplified, such that the cost can be reduced. With this configuration, a resin multilayer substrate that can be easily plastically deformed and can be maintained in a desired shape can be achieved.

In the above manufacturing method, a method of forming joint portions by providing a conductive paste on the second resin layer side of the through hole has been illustrated, but the method is not limited to this method. The joint portions may be formed by, for example, providing a conductive paste including metal powder (metal powder of one or more metals of, for example, Cu and Sn, or of an alloy of these) and a resin material on the surface of the via conductors in the through hole in the joint portion forming step and solidifying the conductive paste by subsequent heat pressing (laminate forming step).

Second Preferred Embodiment

A second preferred embodiment of the present invention illustrates an example of a resin multilayer substrate that has a configuration of via conductors different from that in the first preferred embodiment.

Figure 9:
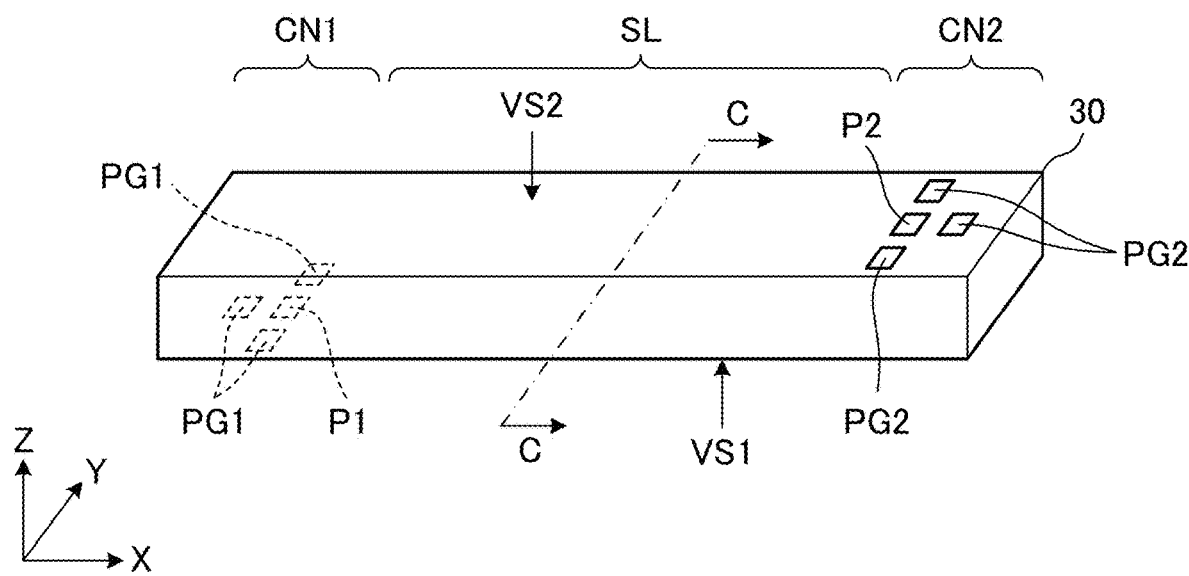
FIG. 9 is an external perspective view of a resin multilayer substrate 102 according to a second preferred embodiment of the present invention.
Figure 10:
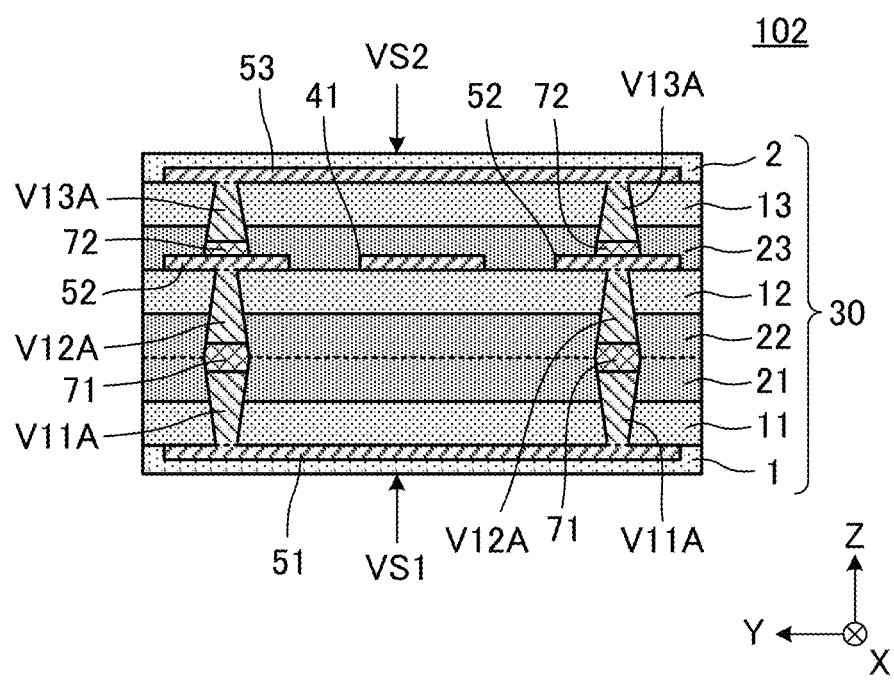
FIG. 10 is a cross-sectional view taken along line C-C in FIG. 9.

FIG. 9 is an external perspective view of a resin multilayer substrate 102 according to the second preferred embodiment. FIG. 10 is a cross-sectional view taken along line C-C in FIG. 9.

The resin multilayer substrate 102 is different from the resin multilayer substrate 101 according to the first preferred embodiment in that it includes a plurality of via conductors V11A, V12A, V13A. The remaining configurations of the resin multilayer substrate 102 are the same or substantially the same as those of the resin multilayer substrate 102.

Hereinafter, a portion different from the resin multilayer substrate 101 according to the first preferred embodiment will be described.

The via conductors V11A, V12A, V13A are made of the same material (Cu) as the planar conductor (ground conductors 51, 52, 53). The via conductors V11A, V12A, V13A have a circular or substantially circular truncated cone shape with one surface having a small area and the other surface having a large area.

One surface of the via conductor V11A (the lower surface of the via conductor V11A in FIG. 10) is connected to the ground conductor 51, and the other surface of the via conductor V11A (the upper surface of the via conductor V11A in FIG. 10) is joined to the joint portion 71. One surface of the via conductor V12A (the upper surface of the via conductor V12A in FIG. 10) is connected to the ground conductor 52, and the other surface of the via conductor V12A (the lower surface of the via conductor V12A in FIG. 10) is joined to the joint portion 71. One surface of the via conductor V13A (the upper surface of the via conductor V13A in FIG. 10) is connected to the ground conductor 53, and the other surface of the via conductor V13A (the lower surface of the via conductor V13A in FIG. 10) is joined to the joint portion 72.

Figure 11:
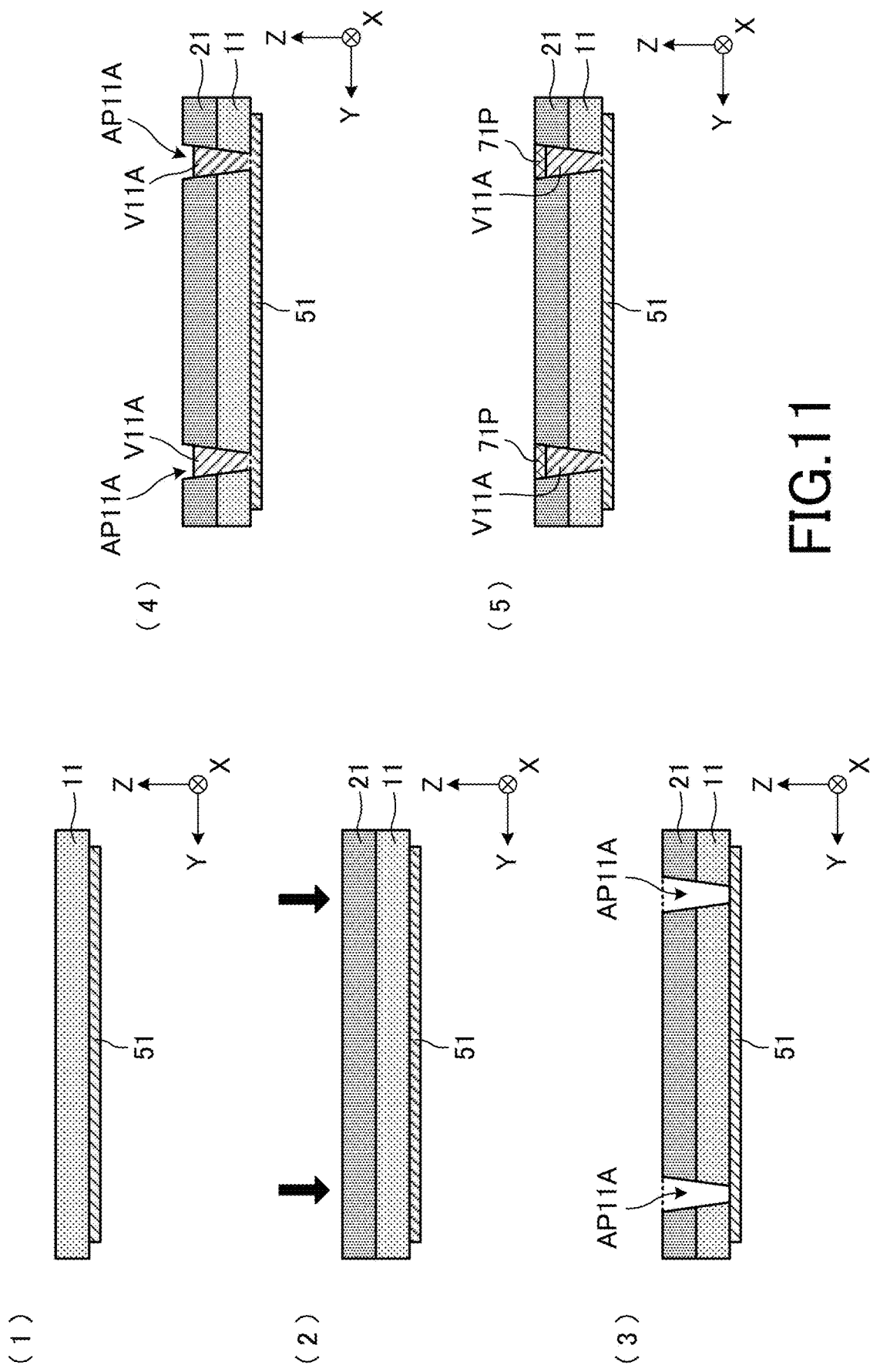
FIG. 11 is a cross-sectional view illustrating processes of forming a via conductor V11A and a joint portion 71P in the first resin layer 11 and the second resin layer 21 before heat pressing in order.
Figure 12:
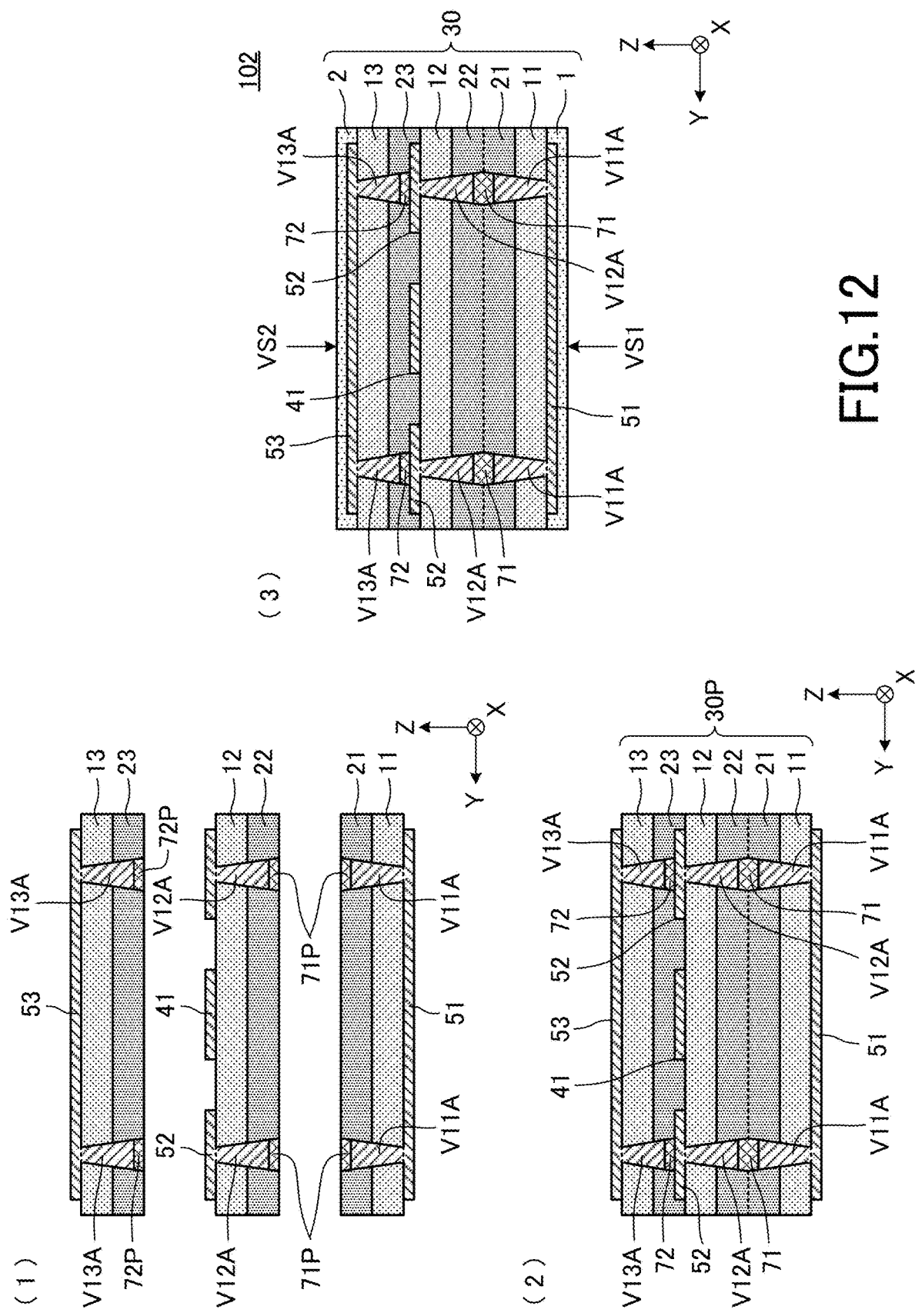
FIG. 12 is a cross-sectional view illustrating the manufacturing process of the resin multilayer substrate 102.

The resin multilayer substrate 102 according to the present preferred embodiment is manufactured by, for example, the following non-limiting example of a manufacturing method. FIG. 11 is a cross-sectional view illustrating the steps of forming the via conductor V11A and the joint portion 71P in the first resin layer 11 and the second resin layer 21 before heat pressing. FIG. 12 is a cross-sectional view illustrating the manufacturing process of the resin multilayer substrate 102.

First, as illustrated in (1) of FIG. 11, the ground conductor 51 or the like is formed on the back surface of the first resin layer 11, and then as illustrated in (2) of FIG. 11, the front surface of the first resin layer 11 and the back surface of the second resin layer 21 are attached to each other. The first resin layer 11 and the second resin layer 21 are the same or substantially the same as those described in the first preferred embodiment.

This step of attaching the second resin layer having a linear expansion coefficient smaller than that of the first resin layer 11 to the first resin layer 11 is an example of the "attaching step".

Next, as illustrated in (3) of FIG. 11, a through hole AP11A is provided through the first resin layer 11 and the second resin layer 21 attached to each other. The through hole AP11A is a through hole having a circular or substantially circular truncated cone shape (tapered shape) with an opening diameter decreasing from the front surface of the second resin layer 21 toward the back surface of the first resin layer 11. The through hole AP11A is formed, for example, by irradiating the front surface of the second resin layer 21 with a carbon dioxide laser beam ($CO_2$ laser beam).

Next, as illustrated in (4) of FIG. 11, at least the first resin layer 11 side of the through hole AP11A is filled with a metal material (Cu or the like) to form the via conductor V11A. Specifically, a plating film is formed on the front surface of the ground conductor 51 in the through hole AP11A and the inner wall of the through hole AP11A by plating. Since the through hole AP11A has a circular or substantially circular truncated cone shape, the via conductor V11A has a circular or substantially circular truncated cone shape with one surface (a surface with a small area) and another surface (a surface with a large area).

This step of providing the through holes AP11A in the attached first resin layer 11 and second resin layer 21 and filling at least the first resin layer 11 side of the through holes AP11A with the metal material to form the via conductor V11A is an example of the "via conductor forming step".

Next, as illustrated in (5) of FIG. 11, the joint portion 71P is provided on at least the second resin layer 21 side of the through hole AP11A so as to be in contact with the via conductor V11A.

This step of providing the joint portion 71P on at least the second resin layer 21 side of the through hole AP11A so as to be in contact with the via conductor V11A is an example of the "joint portion forming step".

Next, as illustrated in (1) of FIG. 12, a plurality of resin layers including the first resin layer 11 and the second resin layer 21 are laminated so that the conductors and the joint portions formed in different resin layers come into contact with each other.

Next, as illustrated in (2) of FIG. 12, the plurality of resin layers (the first resin layers 11, 12, 13 and the second resin layers 21, 22, 23) are heat pressed (collective press) in a laminating direction (Z-axis direction), such that the laminate 30P is formed. The joint portions 71P, 72P are solidified by the heat during the heat pressing and become joint portions 71, 72, respectively, that are more brittle than the via conductors. As a result, the via conductor V11A is joined to the via conductor V12A by the joint portion 71, and the via conductor V13A is joined to the ground conductor 52 by the joint portion 72.

This process of laminating and performing heat pressing on the plurality of resin layers to form a laminate is an example of "laminate forming step".

Thereafter, the protective layer 1 is formed on the lower surface of the laminate 30P (the back surface of the first resin layer 11), and the protective layer 2 is formed on the upper surface of the laminate 30P (the front surface of the first resin layer 13), such that the resin multilayer substrate 101 (laminate 30) is obtained as illustrated in (3) of FIG. 12.

According to the manufacturing method described above, the via conductor V11A is formed by filling a portion of the through hole, having a circular or substantially circular truncated cone shape (tapered shape) with the opening diameter reducing from the front surface of the second resin layer 21 toward the back surface of the first resin layer 11, on the side of the first resin layer 11 with a metal material. According to the manufacturing method, the through hole AP11A has a circular or substantially circular truncated cone shape that is tapered, and thus can be easily filled with the metal material. Further, since the through hole AP11A has a circular or substantially circular truncated cone shape, the via conductor V11A can be formed using a smaller amount of metal material than that in a case where the through hole has a cylindrical shape, such that the cost can be reduced. Furthermore, when the via conductor V11A is formed by plating, the via conductor V11A can be formed with a small amount of metal material, so that the time required for the plating can be shortened.

When the via conductor and the planar conductor (the ground conductors 51, 52, 53) are made of the same material, and the via conductors V11A, V12A, V13A have a circular or substantially circular truncated cone shape with the one surface (a surface with a smaller area) and the other surface (a surface with a larger area) as in the present preferred embodiment, the via conductor preferably include one surface connected to the planar conductor and the other surface connected to the joint portion. Generally, when the bonding area between the via conductor and the other conductor is small, the bonding strength is low, and thus the bonding strength between the one surface of the via conductor and the planar conductor tends to be low. On the other hand, in the present preferred embodiment, the via conductor formed by the plating is integrated with the planar conductor, and thus the strength in the connection portion is high even when the joint area between the via conductor and the planar conductor is small. Therefore, in the first resin layer having a large linear expansion coefficient, even if one surface of the via conductor having a relatively small area and the planar conductor are connected, heating of the resin multilayer substrate is less likely to result in connection failure between the via conductor and the planar conductor. The via conductor and the joint portion are made of different types of metal, and thus the strength of the connection portion between the via conductor and the joint portion is low. In view of this, the other surface of the via conductor is joined to the joint portion, so that the bonding strength between the via conductor and the joint portion can be higher than that in a case where the one surface of the via conductor is joined to the joint portion.

In the present preferred embodiment, the other surfaces of the via conductors V11A, V12A are connected to each other via the joint portion 71 which is in contact with only the second resin layers 21, 22. When the via conductor has a circular or substantially circular truncated cone shape, by connecting the other surfaces of the via conductors having a relatively large area, the occurrence of connection failure due to displacement during lamination of the plurality of resin layers can be reduced from that in a case where the one surfaces of the via conductor are connected to each other.

Third Preferred Embodiment

In a third preferred embodiment of the present invention, an example of a resin multilayer substrate is described in which the first resin layer and the second resin layer have different thicknesses.

Figure 13:
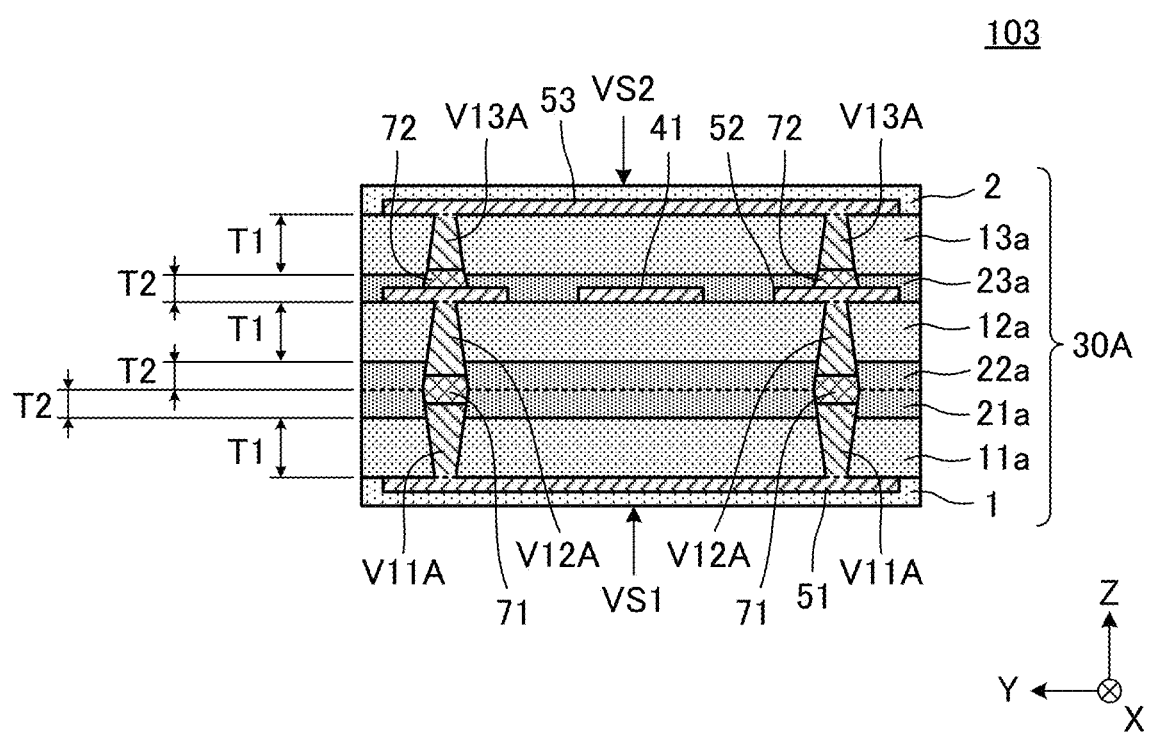
FIG. 13 is a cross-sectional view of a resin multilayer substrate 103 according to a third preferred embodiment of the present invention.

FIG. 13 is a cross-sectional view of a resin multilayer substrate 103 according to the third preferred embodiment.

The resin multilayer substrate 103 is different from the resin multilayer substrate 102 according to the second preferred embodiment in that it includes a laminate 30A. The remaining configurations of the resin multilayer substrate 103 are the same or substantially the same as those of the resin multilayer substrate 102.

Hereinafter, a portion different from the resin multilayer substrate 102 according to the second preferred embodiment will be described.

The laminate 30A is formed by laminating the protective layer 1, a first resin layer 11a, second resin layers 21a, 22a, a first resin layer 12a, a second resin layer 23a, a first resin layer 13a, and the protective layer 2 in this order.

As illustrated in FIG. 13, the thickness (T1) of the first resin layers 11a, 12a, 13a is larger than the thickness (T2) of the second resin layers 21a, 22a, 23a (T1>T2). In the present preferred embodiment, the joint portion 72 is in contact with the first resin layer 13a. In the present preferred embodiment, the thickness of the portion of the joint portion 72 in the second resin layer 23a (the portion of the joint portion 72 in contact with the second resin layer 23a) is larger than the thickness of the portion of the joint portion 72 in the first resin layer 13a (the portion of the joint portion 72 in contact with the first resin layer 13a).

Also with the configuration in which a portion of the joint portion 72 is provided in the second resin layer as described in the present preferred embodiment, the advantageous effects of the present invention of reducing or preventing the damage to the joint portion due to the heating of the resin multilayer substrate can be achieved. As in the present preferred embodiment, the thickness of the portion of the joint portion 72 in the second resin layer 23a is preferably larger than the thickness of the portion of the joint portion 72 in the first resin layer 13a. With the portion of the joint portion 72 in contact with the second resin layer 23a being thick, the stress applied to the joint portion resulted by heating can be reduced. Note that in order to reduce or prevent damage to the joint portion while heating the resin multilayer substrate, the joint portion is more preferably provided only in the second resin layer (to be in contact with only the second resin layer).

The thickness of the first resin layers 11a, 12a, 13a with a lower relative permittivity than the second resin layers 21a, 22a, 23a is larger than the thickness of the second resin layers 21a, 22a, 23a.

The second resin layers 21a, 22a, 23a, such as an LCP, for example, with a small linear expansion coefficient tend to have a high relative permittivity. Thus, as in the present preferred embodiment, with the first resin layers 11a, 12a, 13a designed to have a thickness (T1) larger than the thickness (T2) of the second resin layers 21a, 22a, 23a, a resin multilayer substrate with better high frequency characteristics and a lower risk of breakage of the joint portion when the resin multilayer substrate is heated can be achieved.

Other Preferred Embodiments

In each of the above-described preferred embodiments, an example is described in which the resin multilayer substrate is a cable connecting two circuit boards to each other. However, the resin multilayer substrate is not limited thereto. Resin multilayer substrates according to various preferred embodiments of the present invention may be an electronic component surface-mounted on a circuit board, a cable connecting two members, or a cable connecting a circuit board and another component. A connector may be provided at the connection portion of the resin multilayer substrate, if necessary.

While an example of a multilayer substrate including the first connection portion CN1, the second connection portion CN2, and the line portion SL is described in each of the above-described preferred embodiments, the number of the connection portions and the line portions of the multilayer substrate can be changed as appropriate as long as the advantageous effects of preferred embodiments of the present invention can be achieved.

In each of the above-described preferred embodiments, an example is described where the laminate 30 is a rectangular or substantially rectangular flat plate with the longitudinal direction extending in the X-axis direction. However, the shape of the laminate 30 is not limited thereto. The shape of the laminate 30 can be changed as appropriate as long as the advantageous effects of preferred embodiments of the present invention can be achieved. The planar shape of the laminate 30 may be, for example, L-shape, crank-shape, T-shape, Y-shape, or the like.

In each of the above-described preferred embodiments, an example of a laminate including three first resin layers and three second resin layers is described. However, the laminate is not limited thereto. The number of resin layers (the number of first resin layers and the number of second resin layers) of the laminate may be changed as appropriate as long as the advantageous effects of preferred embodiments of the present invention can be achieved. Further, in the resin multilayer substrate according to a preferred embodiment of the present invention, the protective layers 1, 2 are not necessarily provided. Further, the laminate may include a resin layer other than the first resin layer and the second resin layer.

In each of the above-described preferred embodiments, an example in which the laminate is a flat plate including a thermoplastic resin as the main material is described. However, this configuration should not be construed in a limiting sense. The laminate may be a flat plate made of a thermosetting resin, for example. Alternatively, the laminate may be a composite laminate including a plurality of different resin materials, and for example, may be a configuration including a thermosetting resin sheet, such as a glass/epoxy substrate, and a thermoplastic resin sheet that are laminated. Furthermore, the laminate is not limited to one in which a plurality of resin layers are heat pressed (collectively pressed) to fuse their surfaces with each other, and may have a configuration in which an adhesive layer is provided between each of the adjacent resin layers. For example, the first resin layer and the second resin layer may be attached with the adhesive layer provided in between, or one of the first resin layer and the second resin layer may be an adhesive layer.

The circuit configuration provided on the resin multilayer substrate is not limited to the configuration in each of the above-described preferred embodiments, and can be changed as appropriate as long the advantageous effects of preferred embodiments of the present invention can be achieved. As the circuit provided on the resin multilayer substrate, for example, a coil and an inductor defined by the conductor pattern, a capacitor defined by the conductor pattern, or a frequency filter, such as various filters (low-pass filter, high-pass filter, band-pass filter, band-elimination filter) may be provided. For example, various transmission lines (for example, strip lines, microstrip lines, coplanar lines, or the like) may be provided on the resin multilayer substrate. Furthermore, various electronic components, such as chip components, for example, may be mounted on or embedded in the resin multilayer substrate.

In each of the above-described preferred embodiments, an example of a multilayer substrate in which one transmission line is provided is described. However, this configuration should not be construed in a limiting sense, and the number of the transmission lines can be changed as appropriate depending on the circuit configuration provided on the resin multilayer substrate.

In each of the above-described preferred embodiments, an example is described in which the via conductors V1, V2, V3, V11, V11A, V12, V12A, V13, V13A are made of the same material (Cu) as the planar conductors (the mounting electrodes P1, P2, the signal conductor 41, and the ground conductors 51, 52, 53). However, this configuration should not be construed in a limiting sense. The via conductor may be made of a material (for example, Ni—Sn plating) different from the planar conductor which is Cu, without being more brittle than the joint portion.

In each of the above-described preferred embodiments, an example is described where the plurality of via conductors V11, V11A, V12, V12A, V13, V13A are provided in the transmission direction (X-axis direction). However, this configuration should not be construed in a limiting sense.

The number, arrangement, and the like of the via conductors V11, V11A, V12, V12A, V13, V13A can be changed as appropriate as long the advantageous effects of preferred embodiments of the present invention can be achieved.

In each of the above-described preferred embodiments, an example is described in which the mounting electrode P1 and the ground electrode PG1 having a rectangular or substantially rectangular shape are provided on the first main surface VS1, and the mounting electrode P2 and the ground electrode PG2 having a rectangular or substantially rectangular shape are provided on the second main surface VS2 is described. However, this configuration should not be construed in a limiting sense. The shape, the number, and the position of the mounting electrodes and the ground electrodes can be changed as appropriate as long the advantageous effects of preferred embodiments of the present invention can be achieved. The planar shapes of the mounting electrode and the ground electrode may be, for example, a polygonal shape, a circular shape, an elliptical shape, an arc shape, a ring shape, an L shape, a U shape, a T shape, a Y shape, a crank shape, or the like. The mounting electrode and the ground electrode may be provided on only one of the first main surface VS1 and the second main surface VS2. The resin multilayer substrate may include a dummy electrode, in addition to the mounting electrode or the ground electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a laminate including a plurality of laminated resin layers including a first resin layer and a second resin layer;
   a via conductor in the first resin layer;
   a joint portion including at least a portion in the second resin layer and joined to the via conductor; and
   a conductor in the laminate and connected to the via conductor by the joint portion; wherein
   the joint portion is more brittle than the via conductor;
   a Vickers hardness of the joint portion is lower than a Vickers hardness of the via conductor; and
   a linear expansion coefficient of the second resin layer is larger than a linear expansion coefficient of the via conductor and a linear expansion coefficient of the joint portion, and is smaller than a linear expansion coefficient of the first resin layer.

2. The resin multilayer substrate according to claim 1, wherein the joint portion is not in contact with the first resin layer.

3. The resin multilayer substrate according to claim 1, wherein an interface between the via conductor and the joint portion is positioned in the second resin layer.

4. A resin multilayer substrate comprising:
   a laminate including a plurality of laminated resin layers including a first resin layer and a second resin layer;
   a via conductor in the first resin layer;
   a joint portion including at least a portion in the second resin layer and joined to the via conductor;
   a conductor in the laminate and connected to the via conductor by the joint portion; and
   a planar conductor in the laminate; wherein
   the joint portion is more brittle than the via conductor;
   a linear expansion coefficient of the second resin layer is larger than a linear expansion coefficient of the via conductor and a linear expansion coefficient of the joint portion, and is smaller than a linear expansion coefficient of the first resin layer;
   the via conductor has a circular or substantially circular truncated cone shape including a first surface and a second surface larger than the first surface;
   the first surface of the via conductor is connected to the planar conductor and the second surface of the via conductor is joined to the joint portion; and
   the planar conductor and the via conductor are made of a same material.

5. The resin multilayer substrate according to claim 4, wherein
   the via conductor includes a plurality of via conductors and the second resin layer includes a plurality of second resin layers;
   two of the plurality of second resin layers are adjacent to each other; and
   the second surface of two of the plurality via conductors in the two second resin layers are connected to each other by the joint portion only in contact with the second resin layers.

6. A resin multilayer substrate comprising:
   a laminate including a plurality of laminated resin layers including a first resin layer and a second resin layer;
   a via conductor in the first resin layer;
   a joint portion including at least a portion in the second resin layer and joined to the via conductor; and
   a conductor in the laminate and connected to the via conductor by the joint portion; wherein
   the joint portion is more brittle than the via conductor;
   a linear expansion coefficient of the second resin layer is larger than a linear expansion coefficient of the via conductor and a linear expansion coefficient of the joint portion, and is smaller than a linear expansion coefficient of the first resin layer;
   a relative permittivity of the first resin layer is lower than a relative permittivity of the second resin layer; and
   a thickness of the first resin layer is larger than a thickness of the second resin layer.

7. The resin multilayer substrate according to claim 6, wherein
   the first resin layer includes fluororesin as a main component; and
   the second resin layer includes liquid crystal polymer as a main component.

8. A resin multilayer substrate comprising:
   a laminate including a plurality of laminated resin layers including a first resin layer and a second resin layer;
   a via conductor in the first resin layer;
   a joint portion including at least a portion in the second resin layer and joined to the via conductor; and
   a conductor in the laminate and connected to the via conductor by the joint portion; wherein
   the joint portion is more brittle than the via conductor;
   a linear expansion coefficient of the second resin layer is larger than a linear expansion coefficient of the via conductor and a linear expansion coefficient of the joint portion, and is smaller than a linear expansion coefficient of the first resin layer; and
   the plurality of resin layers are made of thermoplastic resin.

9. A resin multilayer substrate, comprising:
a laminate including a plurality of laminated resin layers including a first resin layer and a second resin layer;
a via conductor in the first resin layer;
a joint portion including at least a portion in the second resin layer and joined to the via conductor; and
a conductor in the laminate and connected to the via conductor by the joint portion; wherein
the joint portion is more brittle than the via conductor;
a linear expansion coefficient of the second resin layer is larger than a linear expansion coefficient of the via conductor and a linear expansion coefficient of the joint portion, and is smaller than a linear expansion coefficient of the first resin layer; and
the laminate includes a bent portion.

* * * * *